United States Patent [19]

Hasegawa

[11] Patent Number: 5,711,681
[45] Date of Patent: Jan. 27, 1998

[54] JUMPER CONNECTOR

[75] Inventor: Miki Hasegawa, Itami, Japan

[73] Assignee: Japan Solderless Terminal Mfg. Co., Inc., Osaka, Japan

[21] Appl. No.: 718,239

[22] Filed: Sep. 20, 1996

[30] Foreign Application Priority Data

Sep. 27, 1995 [JP] Japan .................................. 7-274837

[51] Int. Cl.⁶ .................................................. H01R 4/58
[52] U.S. Cl. ............................ 439/86; 439/510; 439/507
[58] Field of Search ............................ 439/86, 90, 507, 439/510, 512, 149, 509

[56] References Cited

U.S. PATENT DOCUMENTS

| | | | |
|---|---|---|---|
| 3,653,498 | 4/1972 | Kisor | 439/507 |
| 4,223,368 | 9/1980 | Dattlo | 439/507 |
| 4,639,062 | 1/1987 | Taniguchi et al. | 439/86 |
| 4,923,739 | 5/1990 | Jin et al. | 439/86 |
| 5,033,675 | 7/1991 | Shino | 439/86 |
| 5,215,474 | 6/1993 | Rotella | 439/507 |
| 5,340,318 | 8/1994 | Kunihiro | 439/86 |
| 5,462,453 | 10/1995 | Muller | 439/510 |

OTHER PUBLICATIONS

IBM Technical Bulletin, vol. 13, No. 6 (Nov. 1970) p. 1628, Nov. 1970.

*Primary Examiner*—Neil Abrams
*Assistant Examiner*—T. C. Patel
*Attorney, Agent, or Firm*—Antonelli, Terry, Stout, & Kraus, LLP

[57] ABSTRACT

A jumper connector (15) for connecting contact pins or posts (14) protruding from pin header (12) mounted on a printed circuit board (11) has an accessible conductive core (16) made of a conductive elastomer. Two apertures (17) extend through the conductive core so as to tightly fit on the pins or posts (14) that are to be electrically connected one to another. An insulating mantle (18) covers the accessible core (16), such that the connector is rendered simple in structure, produced inexpensively, adapted to a high density arrangement of those pins or posts, and the electric resistance of the core can be set at an easily adjustable level.

16 Claims, 4 Drawing Sheets

JUMPER CONNECTOR

FIELD OF THE INVENTION

The present invention relates to a jumper connector adapted for use to electrically connect two contacts or terminals one to another, wherein the contacts or terminals are present on a printed circuit board or the like.

DESCRIPTION OF PRIOR ART

FIG. 10 shows a typical example of prior art jumper connectors in use with a pin header 2. The pin header mounted on a printed circuit board 1 has an array of contact pins or posts 3. The jumper connector 4 electrically connects any one of those pins to the other neighboring pin. Two sockets 6 fittable on those pins 3 are united together by a conductive piece 7 to form a socket contact 5 secured in an insulating housing 8. Thus, the two pins 3 will communicate with each other through such a socket contact 5.

The prior art jumper connectors 4 are however somewhat disadvantageous in that their socket contacts 5 are complicated in structure and expensive to manufacture. They also occupy a considerably large space on a circuit board, thereby failing to match a high density arrangement of contact pins or posts.

SUMMARY OF THE INVENTION

An object of the present invention is therefore to provide a jumper connector free from the problems mentioned above. Another object is to provide a jumper connector whose core part is made of a conductive elastomer, and simple in structure. The jumper connector proposed herein should be inexpensive, adapted for high density arrays of contact pins and also capable of easily adjusting the resistance of its conductive core.

A jumper connector provided herein for making an electric connection between contact pins or posts protruding from a printed circuit board, or between patterned conductive portions formed thereon, does comprise: an accessible connector core made of a conductive elastomer; at least one inner contact surface formed in or on the accessible core so as to be brought into contact with the pins, posts or patterned portions; and an insulating mantle integrally secured to and covering an outer surface of the accessible core.

The conductive elastomer forming the accessible core contains an amount of a conductive filler dispersed in an elastomeric matrix. The amount is to be adjusted to meet an electric resistance of any level required for the core. The filler may preferably be carbon black or a powder of conductive and stable metal such as copper, nickel and silver.

THE PREFERRED EMBODIMENTS

Figure 1:
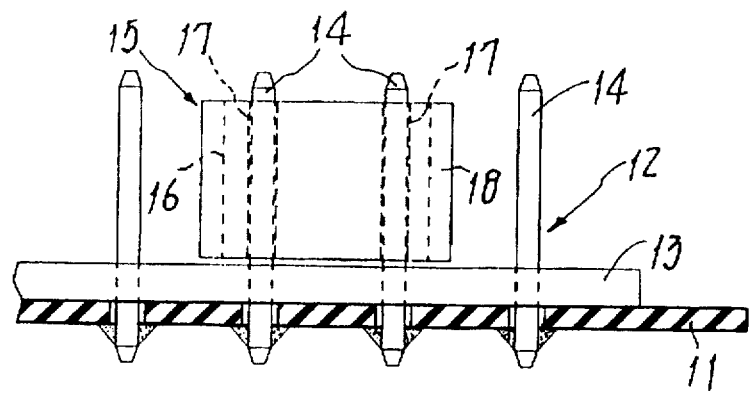
FIG. 1 is a front elevation of a jumper connector shown in use and provided in an embodiment of the present invention.

Some embodiments of the invention will now be described referring to the drawings.

Figure 2:
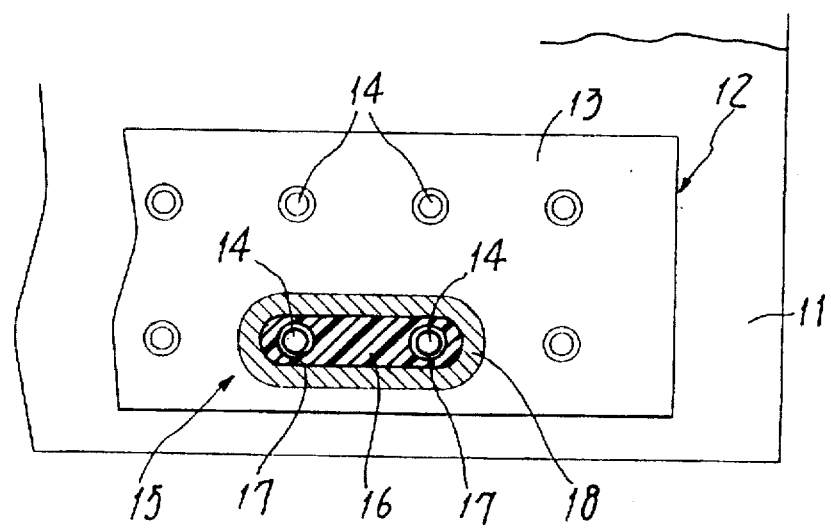
FIG. 2 is a plan view of the jumper connector in use.
Figure 3:
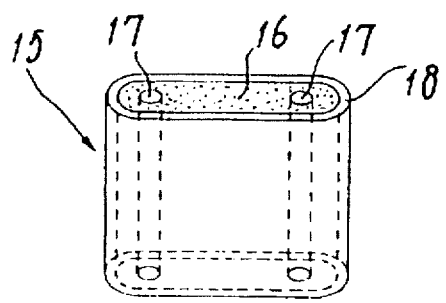
FIG. 3 is a perspective view of the jumper connector.

In an embodiment illustrated in FIGS. 1 to 3, a jumper connector 15 is designed for use with a pin header 12. The pin header is mounted on a printed circuit board 11, and has a base housing 13 which a plurality of upright contact pins or posts 14 penetrate.

The jumper connector 15 comprises an accessible core 16 that is a short column elliptic in cross section and made of a conductive elastomer. A pair of apertures 17 are formed through the core 16 to open at opposite ends thereof. Two contact pins or posts 14 will be fitted in the apertures 17 for making a 'jumper connection'. An insulating mantle 18 made of a nonconductive elastomer covers a whole outer periphery of the accessible core 16.

In manufacture, materials forming the core 16 and the mantle 18 may for example be extruded simultaneously through a common duplex. A composite elongate rod thus produced will subsequently be severed into lengths. In each length, i.e., the jumper connector, the core is integrally bonded to the mantle.

The conductive elastomer forming the core may preferably be a silicone rubber having an amount of carbon black dispersed therein. Carbon black as the conductive filler may be replaced with a powder of any conductive metal such as copper, nickel or silver. The amount of such a filler can be voluntarily selected to meet a required resistance of the accessible core 16.

From a viewpoint of affinity between the materials, the insulating mantle 18 is preferably made of a certain nonconductive elastomer, as noted above. This elastomer may be the same or a different silicone rubber that is free of conductive filler but miscible with the core material. It is also possible to use as the mantle a hard cover formed of Nylon (a registered trademark) or the like insulating plastics.

The jumper connector 15 will be used in a manner as seen in FIGS. 1 and 2. The apertures 17 in accessible core 16 fit on two neighboring pins or posts 14. Due to elasticity of the core 16, those pins electrically connected therethrough will be held in tight contact with inner peripheral surfaces of respective apertures 17. A 'jumper connection' thus made between the pins 14 will have a predetermined electric resistance. This resistance inherent in said core 16 is freely adjustable by varying the amount of conductive filler such as carbon black dispersed in the elastomer, as noted above.

Figure 4:
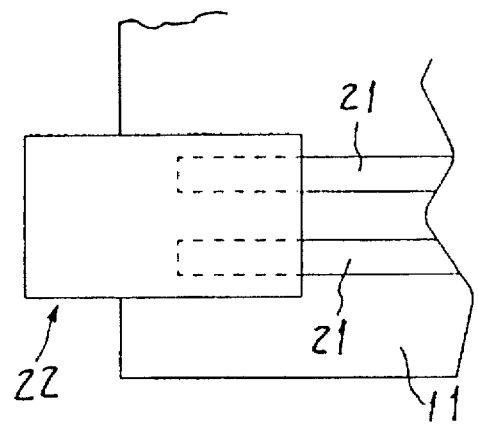
FIG. 4 is a plan view of a jumper connector that is composed in accordance with another embodiment.
Figure 5:
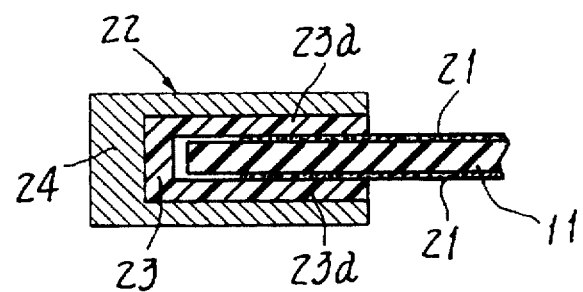
FIG. 5 is a cross section taken along the line 5—5 in FIG. 4.
Figure 6:
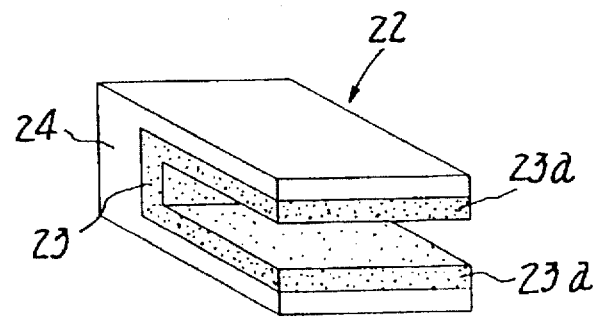
FIG. 6 is a perspective view of the jumper connector shown in FIG. 4.

A jumper connector 22 in a second embodiment shown in FIGS. 4 to 6 is designed for use with a printed circuit board 11 whose patterned conductive portions 21 are to be jumper connected. This connector 22 comprises an accessible core 23 made of a conductive elastomer but is U-shaped in cross section in this case. Therefore, this U-shaped core 23 can grip with its elastic force the circuit board 11. Similarly, an insulating mantle 24 integral with and covering an outer surface of said conductive core 23 is of a U shape. The conductive elastomer forming the accessible core in this case is also preferably composed of a silicone rubber and a conductive filler dispersed therein. The filler is carbon black or a metal powder such as copper, nickel or silver. The amount of filler may be selected to give the core a predetermined resistance. The insulating mantle 24 is preferably made of a nonconductive elastomer free of conductive filler but having affinity to the core material. It is also possible to use as the mantle a hard cover formed of Nylon or the like insulating plastics.

The printed pattern comprises, in addition to the conductive portions or leads 21 formed on an upper surface of the circuit board 11 as shown in FIG. 4, further conductive portions 21 (see FIG. 5) on a lower surface, corresponding to those on the upper surface.

The jumper connector 22 will be used in a manner as seen in FIGS. 4 and 5. The accessible core 23 having arms 23a and 23a facing one another will elastically grip therebetween the printed circuit board 11. Those arms 23a are pressed against the conductive portions 21 and 21 to electrically connect them to each other, thus providing between them a 'jumper connection' of a predetermined electric resistance. Similarly to the first embodiment, this resistance of the core 23 is freely adjustable by varying the amount of conductive filler such as carbon black dispersed in the elastomer.

In a case wherein the insulating cover 24 is made of a silicone rubber or the like elastomer, its elastic force will be exerted to the facing arms 23a of the core 23 so that the latter can more surely contact the patterned portions 21.

Figure 7:
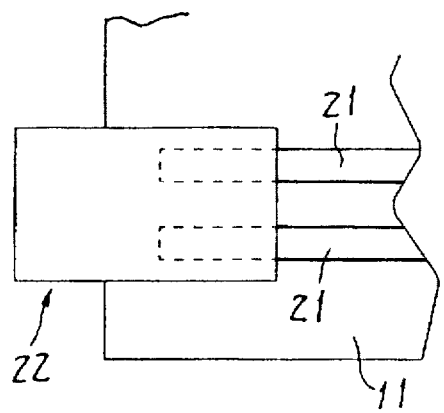
FIG. 7 is a plan view of a jumper connector that is composed in accordance with still another embodiment.
Figure 8:
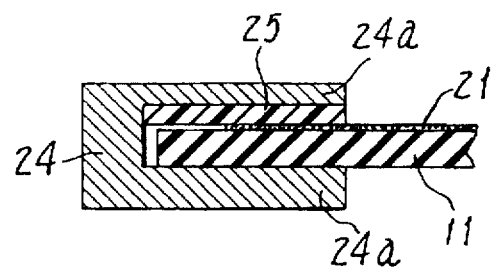
FIG. 8 is a cross section taken along the line 8—8 in FIG. 7.
Figure 9:
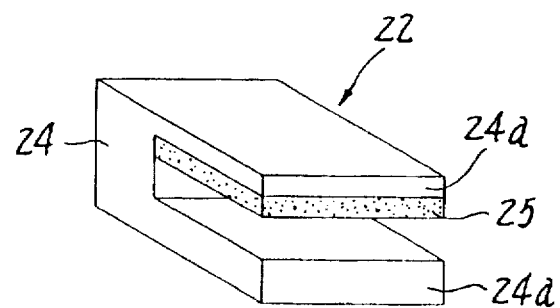
FIG. 9 is a perspective view of the jumper connector shown in FIG. 7.
Figure 10:
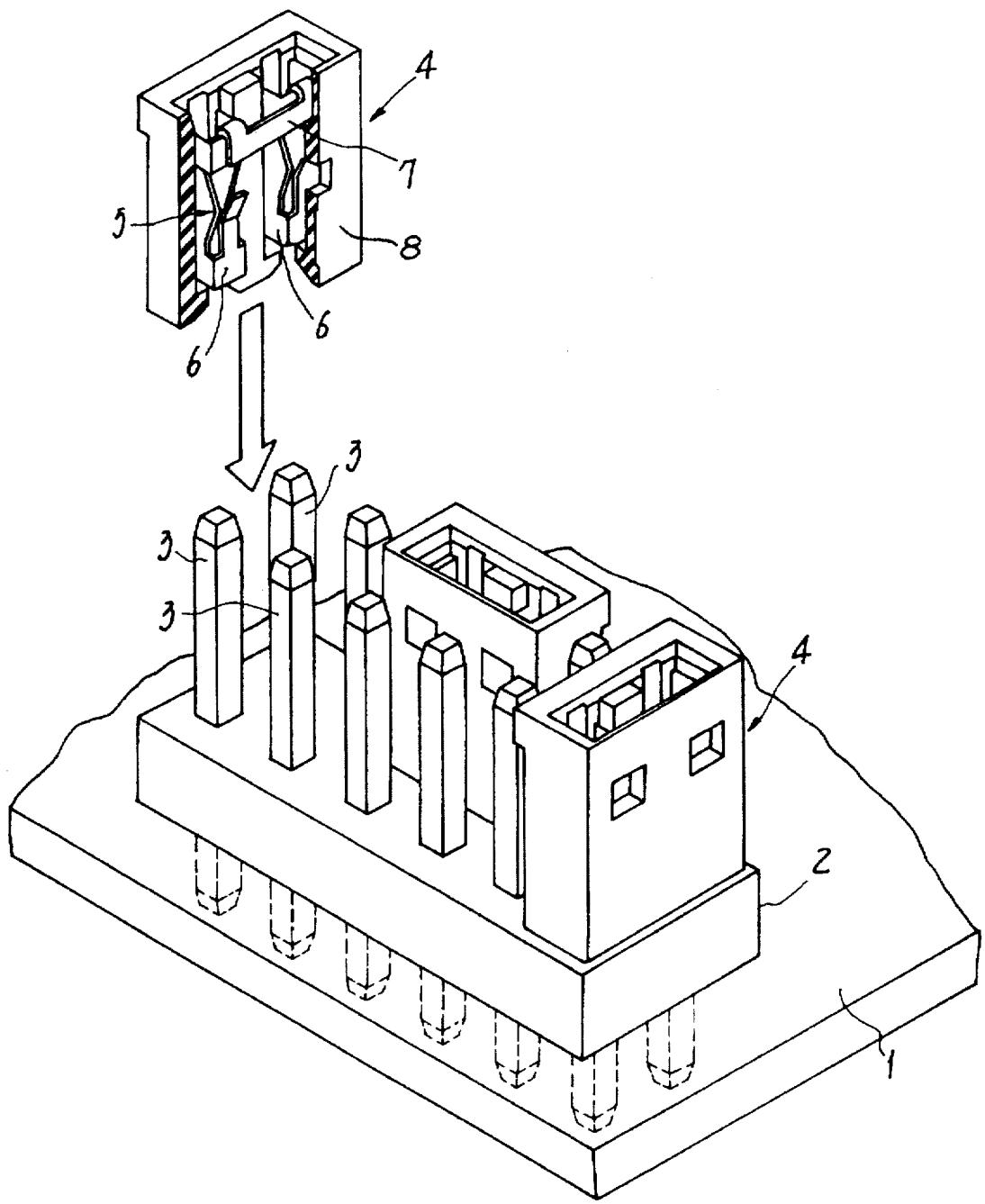
FIG. 10 is a perspective view of the prior art jumper connector shown in use.

A jumper connector 22 in a third embodiment shown in FIGS. 7 to 9 is also designed for use with a printed circuit. This connector is similar to that in the second embodiment except that its accessible core 25 is not U-shaped but plane. Similar reference numerals are allotted to similar parts and description thereof is not repeated.

A core 25 in this case is also made of a conductive elastomer. An insulating cover 24 has arms 24a and 24b facing one another, and the core 25 is secured to an inner face of only one of those arms 24a. The other arm 24b cooperates with the core 25 to elastically grip the circuit board 11. The pressing of the accessible core 25 onto the patterned portions 21 and 21 will be made more effective, if the insulating cover 24 is made of an elastic material and its elastic force is added to the elasticity of the core 25.

In summary, the jumper connector provided herein has a core part made of a conductive elastomer and having two peripheral inner surfaces, or alternatively one or two plane inner surfaces, to be brought into contact with the pins, posts or patterned portions. Since the core part merely need be covered with a nonconductive mantle, the present connector is so simple in structure as to be manufactured at a lower cost. Moreover, this jumper connector is particularly adapted for high density arrays of contact pins or posts.

Since any designer of the connector of the invention can freely select the amount of a filler dispersed in the conductive elastomer, it is easy for him or her to adjust to any desired level the electric resistance of jumper connection made between the pins, posts or between the patterned portions.

What is claimed is:

1. A jumper connector for making an electric connection between contact pins or posts protruding from a printed circuit board, the jumper connector comprising:
   an accessible connector core made of a conductive elastomer;
   at least one inner contact surface formed in or on the accessible core so as to be brought into contact with the pins or posts, said at least one inner contact surface extending a length of the accessible core so as to form at least one aperture extending through an entirety of the length of the accessible core; and
   an insulating mantle integrally secure to and covering an outer surface of the accessible core.

2. A jumper connected as defined in claim 1, wherein the conductive elastomer forming the accessible core contains an amount of a conductive filler dispersed in an elastomeric matrix, and the amount is an amount such that the conductive elastomer has a first level of electric resistance.

3. A jumper connector as defined in claim 2, wherein the filler is selected from a group consisting of carbon black and a powder of conductive metal.

4. A jumper connector as defined in claim 1, 2 or 3, wherein the insulating mantle is formed of a nonconductive elastomer.

5. A jumper connector as defined in claim 1, wherein at least two contact pins or posts are electrically connected by the jumper connector, and wherein the at least one inner contact surface extends so as to form a respective aperture for each contact pin or post.

6. A jumper connector as defined in claim 1, wherein the conductive elastomer is a silicone rubber containing a conductive filler.

7. A jumper connector as defined in claim 1, wherein the inner contact surface is elliptical in cross section.

8. A jumper connector as defined in claim 1, wherein the inner contact surface is provided so as to surround a periphery of each of the contact pins or posts.

9. A jumper connector as defined in claim 3, wherein said conductive metal is selected from the group consisting of copper, nickel and silver.

10. A jumper connector for connecting contact pins or posts protruding from a pin header mounted on a printed circuit board, the jumper connector comprising:
    an accessible conductive core made of a conductive elastomer;
    two apertures extending though the conductive core, at least one of which extends through an entirety of a length of the conductive core, so as to serve as inner peripheral surfaces to be brought into contact with the pins or posts; and
    an insulating mantle secured to and covering the accessible core.

11. A jumper connected as defined in claim 10, wherein the conductive elastomer forming the accessible core contains an amount of a conductive filler dispersed in an elastomeric matrix, and the amount is an amount such that the conductive elastomer has a first level of electric resistance.

12. A jumper connector as defined in claim 11, wherein the filler is selected form a group consisting of carbon black and a powder of conductive metal.

13. A jumper connector as defined in claim 12, wherein the insulating mantle is formed of a nonconductive elastomer.

14. A jumper connector as defined in claim 12, wherein said conductive metal is selected from the group consisting of copper, nickel and silver.

15. A jumper connector as defined in claim 10, wherein the insulating mantle is formed of a nonconductive elastomer.

16. A jumper connector as defined in claim 10, wherein each of the two apertures extends through the entirety of the length of the conductive core.

* * * * *